(12) United States Patent
Uchida

(10) Patent No.: US 6,897,934 B2
(45) Date of Patent: May 24, 2005

(54) ORGANIC ELECTRO LUMINESCENCE DEVICE AND ELECTRONIC APPARATUS

(75) Inventor: Masahiro Uchida, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 329 days.

(21) Appl. No.: 10/096,950

(22) Filed: Mar. 14, 2002

(65) Prior Publication Data

US 2002/0136925 A1 Sep. 26, 2002

(30) Foreign Application Priority Data

Mar. 13, 2002 (JP) .................................. 2002-069004

(51) Int. Cl.$^7$ .......................................... G02F 1/1345
(52) U.S. Cl. .................. 349/152; 349/149; 349/147; 349/140; 257/40; 257/103; 315/169.3; 315/169.1
(58) Field of Search ........................ 315/169.3, 169.1; 313/491, 503, 506, 520; 257/10, 40, 43, 44, 98, 99, 103, E21.514; 349/140, 147, 149, 151, 152, 156, 158, 148, 159; 438/149, 151

(56) References Cited

U.S. PATENT DOCUMENTS

| | | | | | |
|---|---|---|---|---|---|
| 5,668,700 | A | * | 9/1997 | Tagusa et al. | 361/779 |
| 6,028,327 | A | * | 2/2000 | Mizoguchi et al. | 257/98 |
| 6,277,679 | B1 | * | 8/2001 | Ohtani | 438/151 |
| 6,580,479 | B1 | * | 6/2003 | Sekiguchi et al. | 349/96 |
| 6,697,057 | B2 | * | 2/2004 | Koyama et al. | 345/204 |
| 2001/0033355 | A1 | * | 10/2001 | Hagiwara | 349/152 |

FOREIGN PATENT DOCUMENTS

| | | |
|---|---|---|
| JP | 05-152069 | 6/1993 |
| JP | 2000-214794 | 8/2000 |
| JP | 2000-243558 | 9/2000 |

* cited by examiner

Primary Examiner—Haissa Philogene
(74) Attorney, Agent, or Firm—Oliff & Berridge, PLC

(57) ABSTRACT

In an electronic apparatus wherein the terminal of an organic EL device is connected to the terminal of a drive circuit substrate by an anisotropic conductive member, contact resistance between the terminals of the organic EL device and the anisotropic conductive member is reduced, enabling the drive voltage of the organic EL device to be reduced. Terminal covering sections comprise aluminum thin-films, and are provided independently over terminals for anode and the terminal for cathode of the organic EL device. These terminals are made by patterning of an ITO thin-film, as are wirings between the anode and anode terminals of the organic EL device. Continuity paths of an anisotropic conductive rubber member connect the terminals of the organic EL device to terminals of a drive circuit substrate. At this time, the end face of the anisotropic conductive rubber member on the top side of the continuity paths touches the terminal covering sections.

15 Claims, 6 Drawing Sheets

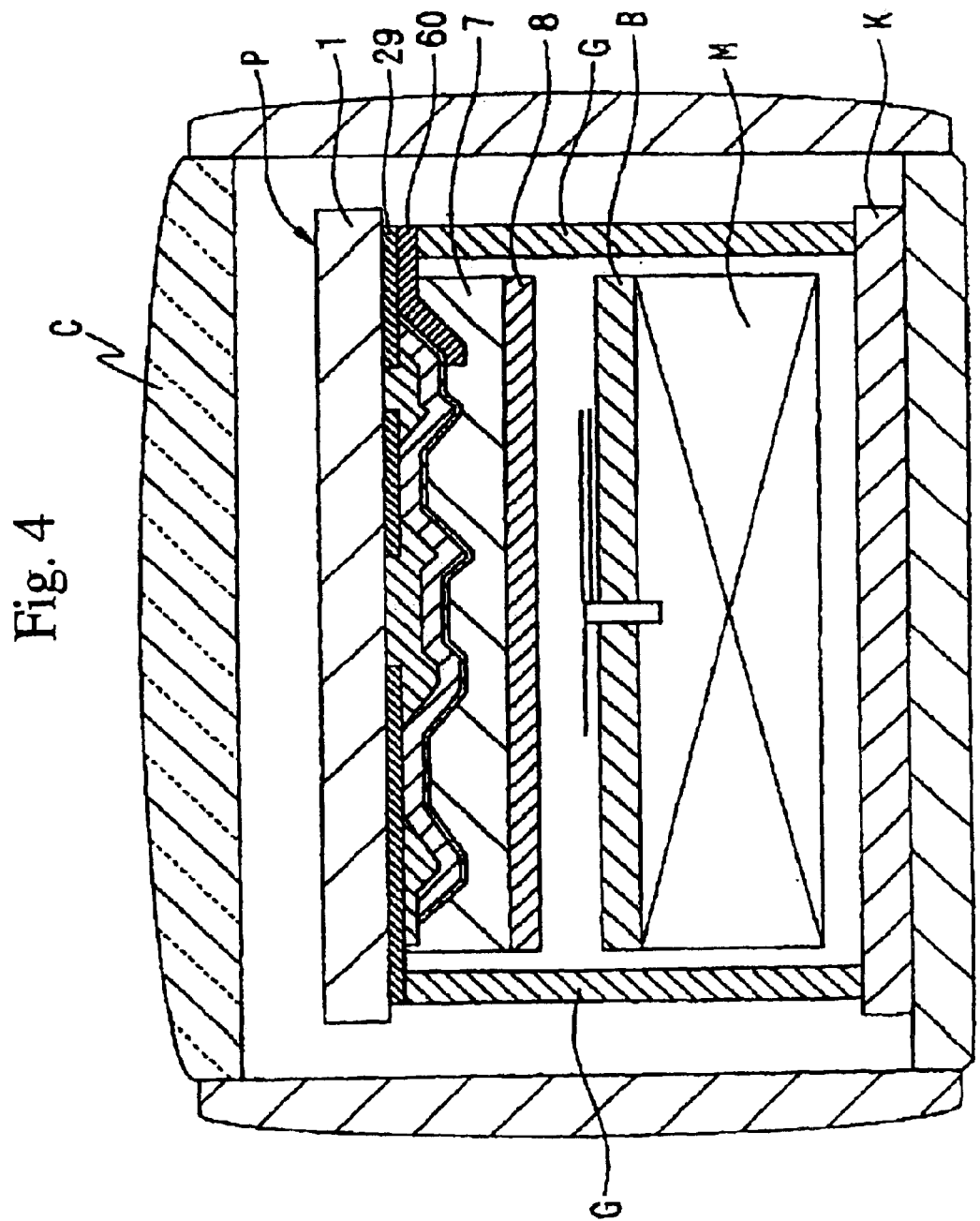

ORGANIC ELECTRO LUMINESCENCE DEVICE AND ELECTRONIC APPARATUS

BACKGROUND OF THE INVENTION

1. Field of the Invention

The present invention relates to an organic electro luminescence (EL) device, and an electronic apparatus (in particular, a clock apparatus such as a wrist watch).

2. Description of the Related Art

An organic EL element is an autonomous light-emitting element, and comprises at least one organic light emitting layer arranged between a cathode and an anode; it can be driven by a direct current of approximately 3V, and can be manufactured to emit a wide variety of colors. The organic EL element has many advantages as a display element, such as having a faster response speed and a wider visual angle than a liquid crystal element, and is expected to be used in various ways, such as in a light source and in pixels of a display apparatus.

For example, in a wrist watch, a transparent organic EL panel having a light-emitting section comprising the organic EL element is provided on a dial (of the wrist watch), making it possible to obtain an analog time display on the dial, and a digital numerical display and the like on the organic EL panel, within the same face.

This type of organic EL element is made as follows. Firstly, a transparent thin-film (ITO thin-film) for anode is provided on a transparent glass substrate. Then, an anode (provided in a predetermined region containing a light-emitting section) of the organic EL element, terminals for the anode, terminals for the cathode, and interconnections between the anode terminals, are patterned simultaneously by photolithography and etching of the thin-film.

With the exception of the light-emitting section of the anode and the terminal sections, the surface of the glass substrate is covered by an insulating layer. Then, a hole injection layer and an organic light-emitting layer are provided on the surface of the glass substrate, excepting the terminal sections. Then, a transparent cathode comprising a predetermined metal thin-film is provided in a region on the surface of the glass substrate which includes the light-emitting section but excludes the terminal sections. Then, all sections except the cathode side terminal section are sealed with a sealant.

At the time of assembling the wrist watch, the organic EL panel and the drive circuit substrate are arranged in parallel at predetermined intervals with their corresponding terminals in alignment, and the dial is provided in parallel between them. A plate-like anisotropic conductive rubber member is provided between their peripheral sections, with the top and bottom end faces of the rubber member touching the faces of the organic EL panel and the drive circuit substrate. The conductive granules of the anisotropic conductive rubber member are dispersed at positions in the rubber member corresponding to the terminals, forming a continuous path of conductive rubber at these positions only; this continuous path connects the terminal of the organic EL panel to the terminal of the drive circuit substrate.

However, in an electronic apparatus such as a wrist watch wherein an anisotropic conductive member connects the terminal of the organic EL panel to the terminal of the drive circuit substrate, the drive voltage must be increased due to the high contact resistance between the anisotropic conductive rubber and the terminal of the organic EL panel.

SUMMARY OF THE INVENTION

In order to solve above problems, the present invention provides an organic EL device characterized in the organic EL device having an organic EL element, a first terminal connected to a cathode of the organic EL element and a second terminal connected to an anode of the organic EL element on the substrate, at least one terminal is covered by a material of which conductivity and oxidization resistance are higher than the material organizing the terminal.

The terminals are made by, for example, patterning of a transparent thin-film doe anode, together with wirings between the anode and cathode terminals of the organic EL device.

Preferably, in the organic EL device of this invention, the material of the terminals comprises ITO ($In_2O_3$—$SnO_2$), and the covering material comprising one of aluminum (Al), silver (Ag), gold (Au), tantalum (Ta), tungsten (W), platinum (Pt), molybdenum (Mo), and chrome (Cr), or an alloy of these metals.

IDIXO ($In_2O_3$—$ZnO$) is one example of a material other than ITO which may be used for the terminals; in this case, the materials described above may be used as the covering material.

The thickness of the cover is not restricted in any way, and need only be sufficient to achieve adequate conductivity, though a thickness of 50 to 500 nm is preferable. There are no particular restrictions on the method of forming the cover, which may, for example, be provided by ion beam deposition, thermal resistance deposition, sputtering, CVD, and the like. The width of the cover can be approximately the same as the width of the terminal, or can be made greater than the width of the terminal without touching the adjacent terminals.

The present invention further provides an electronic apparatus comprising a display, a drive circuit substrate which supplies a drive current to the display, and an anisotropic conductive member which connects a terminal of the display to a terminal of the drive circuit substrate. The constitution is one wherein contact resistance between the terminal of the display and the anisotropic conductive member is reduced.

Preferably, in the electronic apparatus according to this invention, the material of the terminal of the display comprises ITO ($In_2O_3$—$SnO_2$), and the constitution is achieved by providing a layer comprising one of aluminum (Al), silver (Ag), gold (Au), tantalum (Ta), tungsten (W), platinum (Pt), molybdenum (Mo), and chrome (Cr), or an alloy of these metals, between the terminal and the anisotropic conductive member.

The present invention further provides an electronic apparatus comprising a display, a drive circuit substrate which supplies a drive current to the display, and an anisotropic conductive member which connects a terminal of the display to a terminal of the drive circuit substrate, the display comprising the organic EL device of this invention.

The terminal for cathode and terminal for anode of the organic EL device are, for example, made by patterning a transparent thin-film for anode (ITO film or the like) having a comparatively high resistance, together with the wiring between the anode and anode terminal of the organic EL device. In this case, by providing the cover over the terminals in the manner of the organic EL device of this invention, the contact resistance between the terminals and the conductive rubber can be reduced.

Furthermore, in the electronic apparatus of the present invention, it is possible that a cathode of the organic electro luminescence device is transparent, a transparent insulating layer covers all sections other than light-emitting sections and terminal sections, and a dial is viewed through the organic electro luminescence apparatus.

The transparent cathode comprises, for example, a two-layer thin-film comprising a first cathode layer (light-emitting layer side) of (1) a thin-film obtained by jointly depositing magnesium (Mg) and silver (Ag), (2), a thin-film obtained by jointly depositing lithium (Li) and aluminum (Al), (3) a material having a low work coefficient, and a second cathode layer of a material having a higher work coefficient than the first layer; the total thickness of the two-layer thin-film is, for example, less than 140 Å. The material of the first cathode layer comprises, for example, calcium (Ca) or magnesium (Mg), and the material of the second cathode layer comprises, for example, aluminum (Al), silver (Ag), or gold (Au).

The transparent insulating layer comprises, for example, $SiO_2$, polyamide, polystyrene, acrylic resin, and lithium fluoride (LiF), and has a thickness of for example 50 nm to 150 nm. This insulating layer is formed by method such as, for example, sputtering, CVD, deposition, and spin coating. In the electronic apparatus of the present invention, the anisotropic conductive member may be an anisotropic rubber. In the electronic apparatus of the present invention, the anisotropic conductive member may be an anisotropic conductive film.

BRIEF DESCRIPTION OF THE DRAWING

FIG. 4 is a cross section of a wrist watch corresponding to an embodiment of an electronic apparatus according to this invention.

DETAILED DESCRIPTION OF THE INVENTION

Embodiments of the present invention will be explained.

Figure 1:
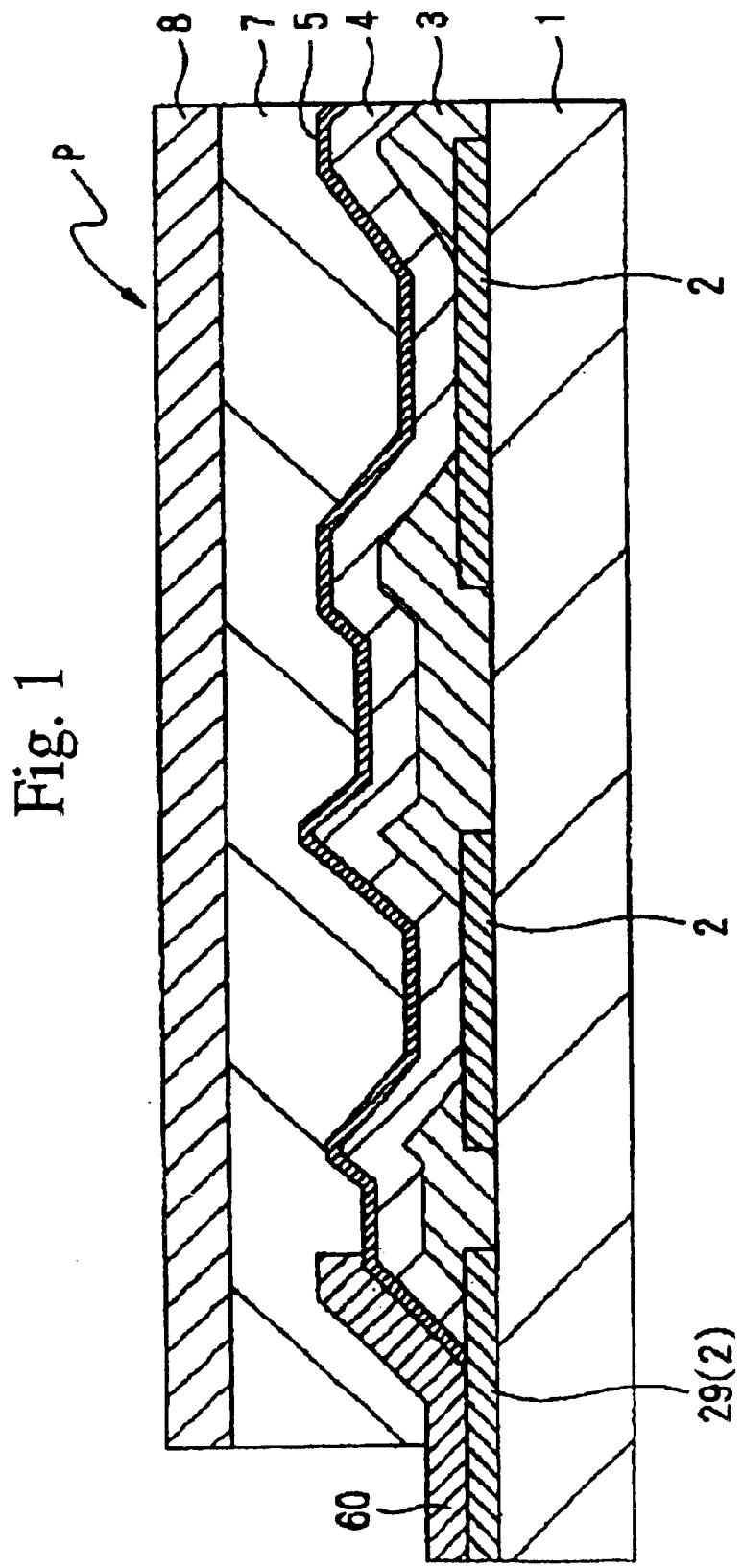
FIG. 1 is a cross section of an embodiment of an organic EL panel according to this invention.
Figure 2A:
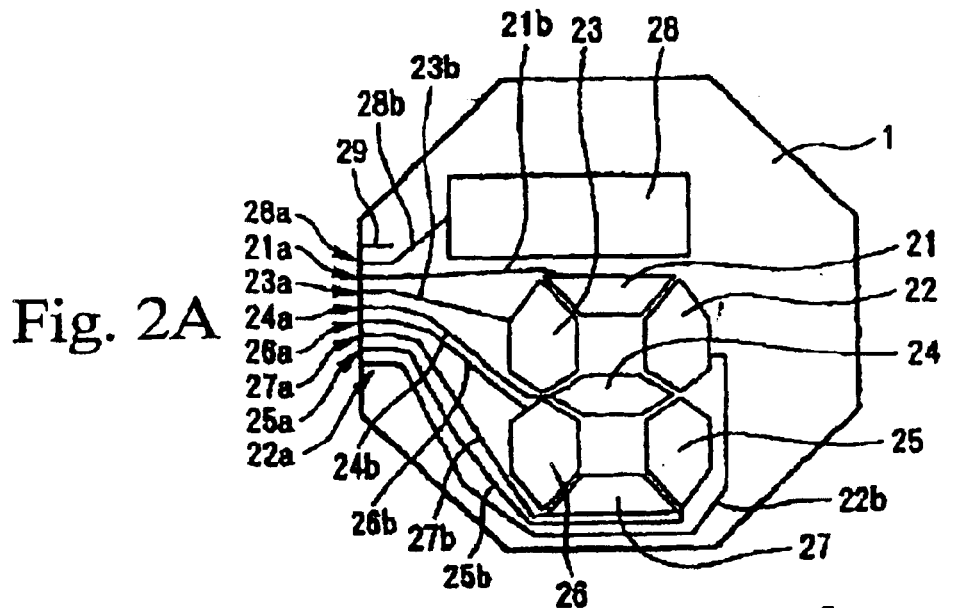
FIGS. 2A to 2C are plan views of manufacturing processes of the organic EL panel of FIG. 1.
Figure 2B:
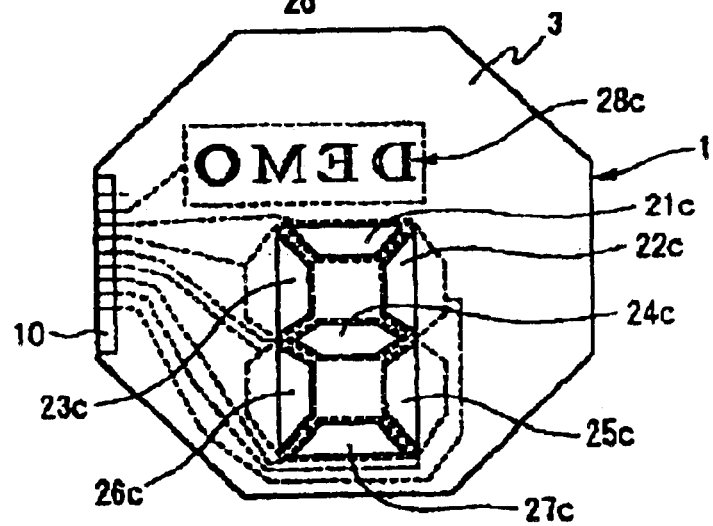
Figure 2C:
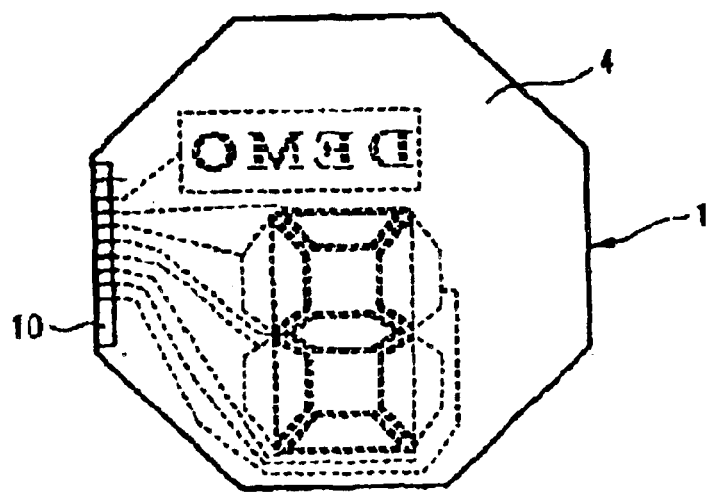
Figure 3A:
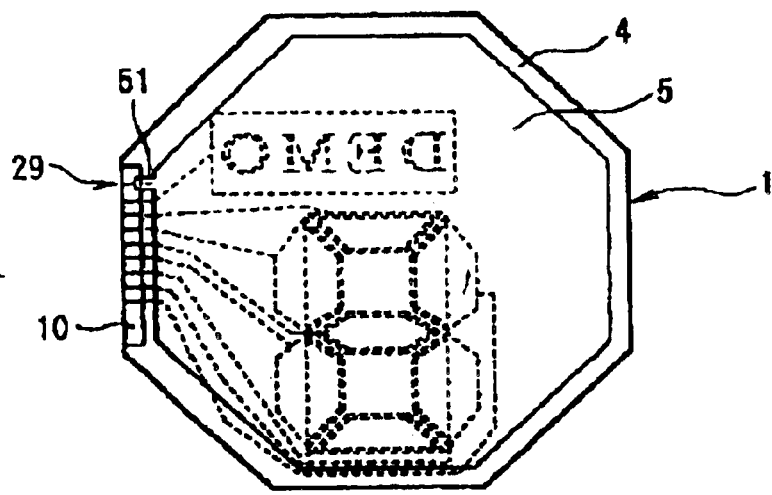
FIGS. 3A to 3C are plan views of manufacturing processes of the organic EL panel of FIG. 1.
Figure 3B:
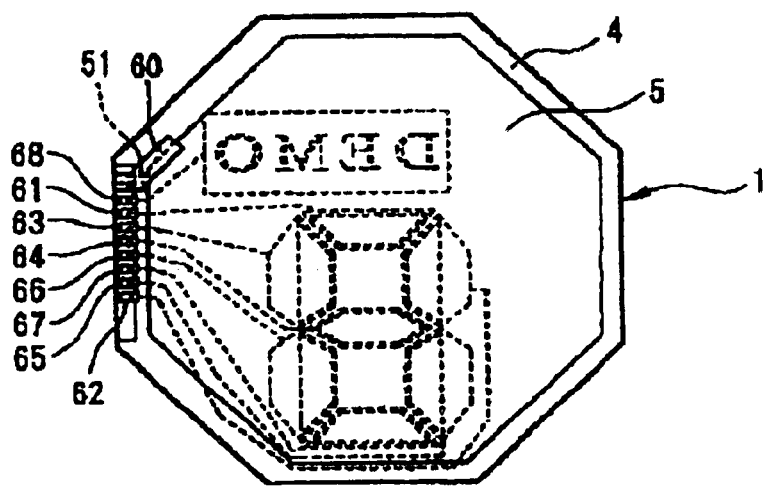

An embodiment of an organic EL panel according to the present invention is explained with reference to FIGS. 1 to 3. FIG. 1 is a cross section of the organic EL panel. FIGS. 2A to 2C and 3A to 3C are plan views of manufacturing steps of the organic EL panel.

The organic EL panel of this embodiment is a transparent organic EL panel as a light-generating section made from organic EL element, and comprising seven elements forming digital numerals and the letters "DEMO". The organic EL panel is used on a dial of a wrist watch, functioning as a display which displays digital numerals and the letters "DEMO" on the dial by generating light in the organic EL element as required.

This type of organic EL panel is formed as follows.

Firstly, a transparent thin-film for anode 2 is formed on a transparent octagonal glass substrate 1. Then, photolithography and etching of the thin-film is performed. This simultaneously makes the patterns of seven anodes for elements 21 to 27, one rectangular anode 28 corresponding to the seven elements mentioned above, terminals for anodes 21a to 28a, a terminal for cathode 29, and wirings 21b to 28b for connecting anodes to the terminals. This state is shown in FIG. 2A.

Subsequently, with the exceptions of the element sections (light-generating sections) 21c to 27c of the anodes for element 21 to 27, the section (light-generating section) 28c of the anode 28 for the letters "DEMO", and the terminal section 10, the glass substrate 1 is covered with a transparent insulating layer 3. This state is shown in FIG. 2B.

Subsequently, with the exception of the terminal section 10, an organic light-emitting layer (e.g. a hole injection layer/light-emitting layer/electron transport layer) 4 is provided on the surface of the glass substrate 1. This state is shown in FIG. 2C. Consequently, as shown in FIG. 1, the light-generating organic layer 4 contacts the element sections (light-emitting sections) 21c to 27c and the section (light-emitting section) 28 of the letters "DEMO", and is separated from all other sections by the insulating layer 3.

Subsequently, a transparent cathode 5 is formed on the surface of the glass substrate 1, excluding the entire periphery (including the terminal section 10) of the glass substrate 1. There is a small rectangular protrusion from one side of the octagonal transparent cathode 5, and this protrusion 51 makes the transparent cathode 5 contact the terminal for cathode 29. This state is shown in FIG. 3A.

Terminal covering sections 61 to 68, and 60 comprise aluminum thin-films, and are formed independently on the terminals for anode 21a to 28a and the terminal for cathode 29 on the surface of the glass substrate 1. The terminal covering section for cathode 60 covers not only over the terminal 29, but also part of the terminal 29 side of the transparent cathode 5, that is, the protrusion 51 on the terminal 29 and a section having a predetermined length along the side of the octagon at the base of the protrusion 51 (not the terminal for cathode side but the side running to the opposite side thereof). This state is shown in FIG. 3B.

Subsequently, as shown in FIG. 1, a sealant layer 7 is formed over the surface of the glass substrate 1 (the face which the transparent cathode 5 is provided on) excluding the terminal section 10, and a glass substrate for sealing 8 is fixed on top of the sealant 7. This realizes an organic EL panel P disposed over the dial of a wrist watch for use.

The terminal for cathode 29 of the organic EL panel and the terminals for anode 21a to 28a are connected to corresponding terminals of the drive circuit, and current is passed between the seven elements forming the digital numerals, the terminals 21a to 28a of the anodes 21 to 28 in the section of "DEMO" to be lit, and the terminal for cathode 29. As a result, the electrically conducting section of the organic EL panel emits light, displaying one of the digital numerals "91" to "98" and/or the letters "DEMO".

Figure 3C:
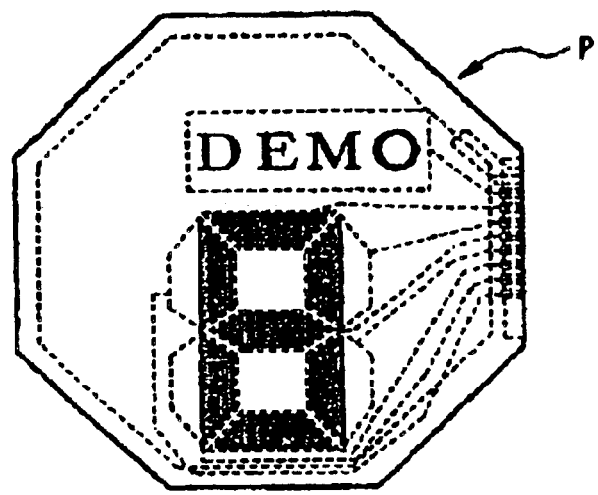

FIG. 3C shows the state when all the terminals for anodes 21a to 28a of the organic EL panel are connected to the terminal for cathode 29, and the digital numeral "8" and "DEMO" are both displayed.

When the organic EL panel having the following constitution was manufactured and a direct current of 3V was impressed thereto, it was confirmed that light of a practical degree of intensity was emitted for the digital numeral "8" and "DEMO".

glass substrate 1: soda glass with a thickness of 0.7 mm transparent thin-film for anode 2: an ITO thin-film with a thickness of 150 nm transparent insulating layer 3: SiO2 film with a thickness of 150 nm organic light emitting layer 4: a positive pore-treated layer having a thickness of 50 nm, and comprising, from the insulating layer side 3, N,N'-diphenyl-N,N'-dinaphtyl-1,1'-biphenyl-4,4'-diamine, and an electron transporting light emitting layer comprising a tins (8-hydroxykinolium) aluminum complex transparent cathode 5: a calcium (Ca) thin-film having a thickness of 120 □ (12 nm) and a metal (Au) thin-film having a thickness of 20 □ (2 nm)

terminal covering section for cathode 60: thickness of 200 nm and width of 0.2 mm terminal covering sections for cathode 61 to 68: thickness of 200 nm and width of 0.2 mm sealing layer 7: a layer of epoxy resin having a thickness of 2 $\mu$m glass substrate for sealing 8: soda glass having a thickness of 0.1 mm An embodiment of the electronic apparatus of this invention will be explained using FIG. 4. The electronic apparatus is a wrist watch comprising the organic EL panel P, described above, on a dial B, and can realize an analog time display by using the dial, and a digital numerical display and the like by using the organic EL panel, within the same face. Reference "C" in FIG. 4 represents a cover glass.

The dial B is driven by an analog movement M, and the organic EL panel P is driven by a drive circuit substrate K. An anisotropic conductive rubber member G is provided between the organic EL panel P and the drive circuit substrate K. The anisotropic granules of the anisotropic conductive rubber member G are dispersed at positions corresponding to terminals in the anisotropic conductive member G, thereby forming a continuous path of conductive rubber at these positions only; this continuous path connects the terminal of the organic EL panel P to the terminal of the drive circuit substrate K.

When assembling the wrist watch, the organic EL panel P and the drive circuit substrate K are arranged in parallel at predetermined intervals with their corresponding terminals in alignment; the dial B has the analog movement M attached to its bottom face, and is provided in parallel between the organic EL panel P and the drive circuit substrate K. The plate-like anisotropic conductive rubber member G is provided between the peripheral sections of the organic EL panel P and the drive circuit substrate K, with the top and bottom end faces of the anisotropic conductive rubber member G touching the faces of the organic EL panel P and the drive circuit substrate K.

In the organic EL panel P, the terminal covering sections 60 to 68 comprise aluminum thin-films, and are provided independently over the terminals for anode 21a to 28a and the terminal for cathode 29; therefore, the end face of anisotropic conductive rubber member G on the top side of the continuity paths touches the terminal covering sections 60 to 68. FIG. 4 is a cross section, taken at the position of the terminal for cathode 29, and shows that the face of the terminal covering section 60 of the terminal for cathode 29 is contacting the end face of the anisotropic conductive rubber member G.

Therefore, in this wrist watch, the terminals for anode 21a to 28a and the terminal for cathode 29 contact the continuity paths of the anisotropic conductive rubber member G, not directly, but via the terminal covering sections 60 to 68 there between; consequently, there is less contact resistance between the anisotropy conductive rubber member G and the organic EL panel than when they contact each other directly. This enables the drive voltage of the organic EL panel P to be reduced. For example, a drive voltage of 4.5 V for a constitution without the terminal covering sections 60 to 68 can be reduced to 3.0 V by providing the terminal covering sections 60 to 68.

Furthermore, since the terminal covering section for cathode 60 also covers part of the terminal 29 side of the transparent cathode 5, the terminal covering section 60 in this part also acts as a protective film over the transparent cathode 5.

Incidentally, although the explanation of this embodiment describes an electronic apparatus (watch) using the organic EL panel as a display, the present invention can be applied an electronic apparatus using a display other than an organic EL panel (e.g. a liquid crystal display), provided that the electronic apparatus is one wherein the terminal of the display drive by electrical conduction is connected to the drive circuit substrate by anisotropic conductive rubber.

In the above embodiment, contact resistance between the terminal of the display and the anisotropic conductive rubber member is reduced by providing the metal thin-film of aluminum between them, but an acceptable alternative is to provide the contact faces of the terminal of the display and the anisotropic conductive rubber with convexo-concave shapes which engage each other. In this constitution, the increased area of the contacting faces reduces the contact resistance between the terminal of the display and the anisotropic conductive rubber member .

The metal thin-film need not be fixed to the terminal in the manner described above, and may be fixed to the side of the anisotropic conductive rubber instead. Alternatively, instead of fixing the metal thin-film to the terminal or the anisotropic conductive rubber, it may be inserted and supported between their side faces.

Although the above embodiment refers to a clock apparatus comprising a wrist watch, the electronic apparatus of this invention may alternatively comprise a mobile terminal, a wall clock, a table clock, a video camera, and the like.

Additional Embodiment

An additional embodiment of this invention will be explained using FIGS. 5 and 6. The present invention can be applied to the organic EL panel having passive matrix-structure as shown in FIG. 5.

Figure 5:
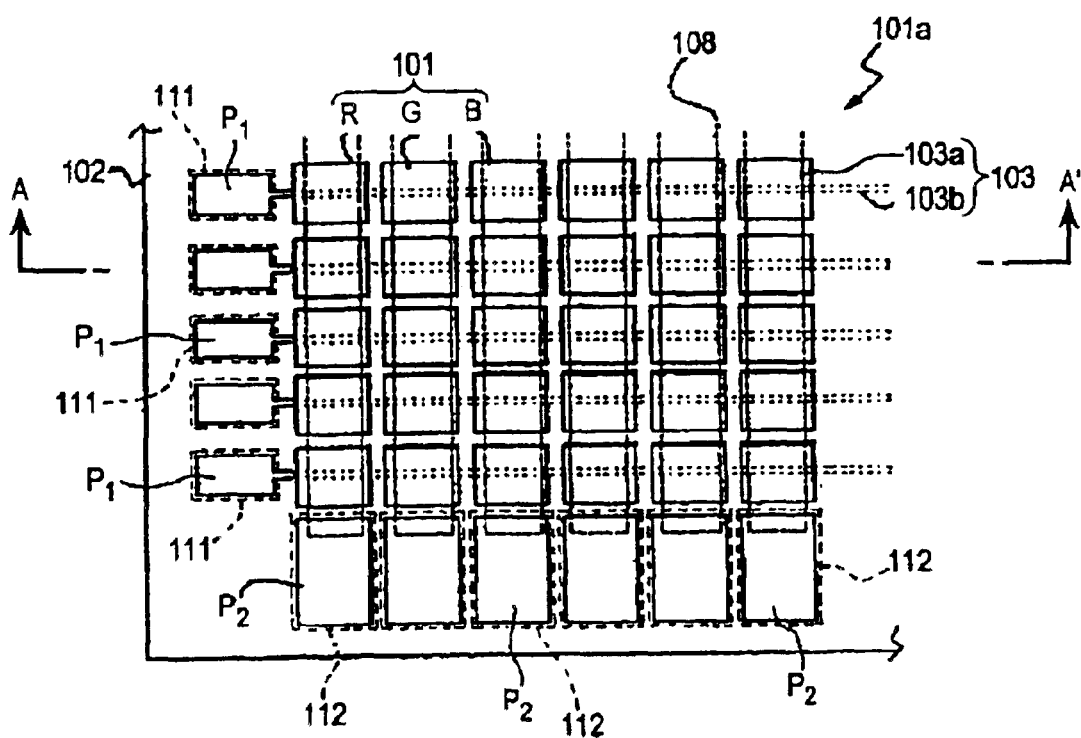
FIG. 5 is a front view of an organic EL panel according to an additional embodiment

As shown in FIG. 5, this type of organic EL panel has an image display arrangement region 101a comprising a plurality of light-emitting pixels 101, comprising red R, green G, and blue B light-emitting sections, arranged in a matrix on a glass substrate 102, and a plurality of terminal pads P1 and P2 (P1: terminal pads for first display electrode line, P2: terminal pads for second display electrode line), formed at the periphery of the image display arrangement region 101a (i.e. the glass substrate 102).

A first display electrode line 103 comprises a plurality of island-like transparent electrodes 103a comprising a material having a high work coefficient such as ITO, and a bus line 103b which electrically connects the island-like transparent electrodes 103a, and is formed in the image display arrangement region 101a. As shown in FIG. 5, a plurality of the first display electrode lines 103 are arranged as horizontal stripes at predetermined intervals on the glass substrate 102. The bus line 103b comprises an electrically conductive low-resistance metal, such as Al, Cu, and Au. Light-emitting sections are formed at the wirings between second display electrode lines 109 (explained below) and the first display electrode lines 103, especially at the wirings between transparent electrodes.

Figure 6:
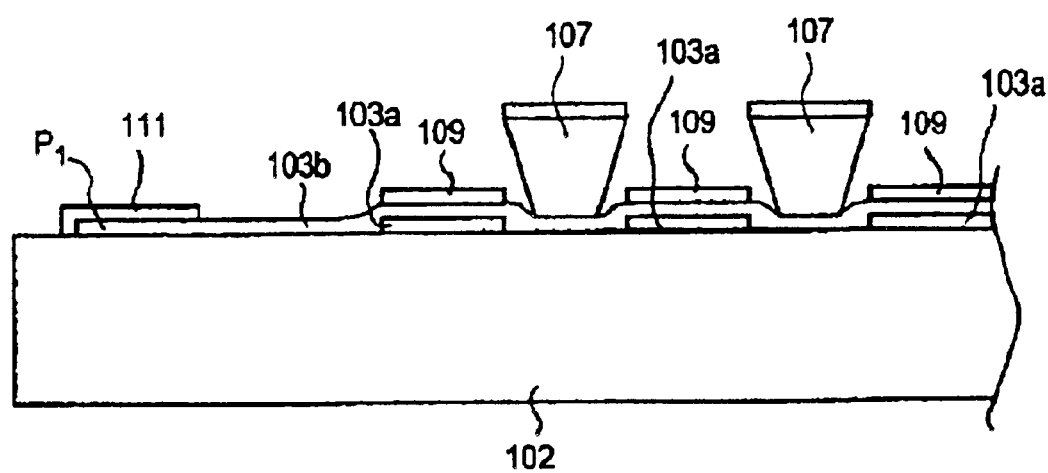
FIG. 6 is a cross section taken along the line A–A' of FIG. 5.

Furthermore, as shown in FIG. 6, a plurality of electrically insulating partition walls 107 protrude from the glass substrate 102, and cross over the glass substrate 102 and the first display electrode line 103 at a right angle to the first display electrode line 103. That is, the partition walls 107 is formed to expose at least one part of the first display electrode lines 103, in particular the island-like transparent electrodes 103a.

Second display electrode lines 109 are formed directly over the island-like transparent electrodes 103a between the partition walls 107, and extends in a vertical stripe-like shape. The second display electrode lines 109 comprise a material having a low work coefficient such as Al, Mg, Li, or an alloy of these.

The ends of the first display electrode lines 103 are connected to the terminal pads for first display electrode line P1, and the ends of the second display electrode lines 109 are connected to the terminal pads for second display electrode line P2. Terminal covering sections 111 and 112 comprise aluminum thin-films, and are formed independently over the terminal pads P1 and P2 respectively.

Then, the terminal covering sections 111 and 112 are electrically connected to the drive circuit substrate via a anisotropic conductive film having the same functions as that described above, and are driven by the drive circuit substrate. Therefore, even in an organic EL panel having of the simple-matrix constitution described above, there is less contact resistance between the terminal pads P1 and P2 of the organic EL panel and the anisotropic conductive film, enabling the drive voltage of the organic EL panel at the time of mounting to be reduced.

As described above, when the organic EL panel of this invention is used as an organic EL panel of an electronic apparatus wherein the terminal of the organic EL panel is connected to the terminal of a drive circuit substrate by an anisotropic conductive member, there is less contact resistance between the terminals of the organic EL panel and the anisotropic conductive member, thereby enabling the drive voltage of the organic EL panel to be reduced.

According to the electronic apparatus of this invention, contact resistance between the terminal of a display and the anisotropic conductive rubber can be reduced, enabling the drive voltage of the electronic apparatus to be reduced.

What is claimed is:

1. An organic electro luminescence device comprising:
   an organic electro luminescence element;
   a first terminal which is connected to a cathode of the organic electro luminescence element; and
   a second terminal which is connected to an anode of the organic electro luminescence element,
   at least one of said terminals being covered by a material having higher conductivity and higher oxidation-resistance than the material of said terminals.

2. The organic electro luminescence device according to claim 1, the material of said terminals comprising ITO ($In_2O_3$—$SnO_2$), and the covering material comprising one of aluminum (Al), silver (Ag), gold (Au), tantalum (Ta), tungsten (W), platinum (Pt), molybdenum (Mo), and chrome (Cr), or an alloy of these metals.

3. An electronic apparatus comprising:
   a display;
   a drive circuit substrate which supplies a drive current to the display; and an anisotropic conductive member which connects a terminal of the display to a terminal of the drive circuit substrate, said display comprising the organic electro luminescence device according to claim 2.

4. An electronic apparatus comprising:
   a display;
   a drive circuit substrate which supplies a drive current to the display; and an anisotropic conductive member which connects a terminal of the display to a terminal of the drive circuit substrate, said display comprising the organic electro luminescence device according to claim 1.

5. An electronic apparatus according to claim 4, the anisotropic conductive member being anisotropic conductive rubber.

6. An electronic apparatus comprising a display comprising:
   a drive circuit substrate which supplies a drive current to the display; and
   an anisotropic conductive member which connects a terminal of the display to a terminal of the drive circuit substrate; and
   a terminal covering section,
   a contact resistance between the terminal of said display and the terminal of said anisotropic conductive member being reduced.

7. An electronic apparatus according to claim 6, the anisotropic conductive member being anisotropic conductive rubber.

8. An electronic apparatus according to claim 6, the anisotropic conductive member being anisotropic conductive film.

9. The electronic apparatus according to claim 6,
   the material of the terminal of said display being ITO ($In_2O_3$—$SnO_2$), and a layer comprising one of aluminum (Al), silver (Ag), gold (Au), tantalum (Ta), tungsten (W), platinum (Pt), molybdenum (Mo), and chrome (Cr), or an alloy of these metals being formed between the terminal and said anisotropic conductive member.

10. An electronic apparatus according to claim 9, the anisotropic conductive member being anisotropic conductive rubber.

11. An electronic apparatus according to claim 9, the anisotropic conductive member being anisotropic conductive film.

12. An electronic apparatus according to claim 4, the anisotropic conductive member being anisotropic conductive film.

13. An electronic apparatus comprising:
   a transparent cathode of an organic electro luminescence device;
   a transparent insulating layer covering a surface of a substrate except light-emitting sections and terminal sections of the substrate, the substrate being connected to the cathode to drive the organic electro luminescence device; and
   a dial that can be viewed through the organic electro luminescence device.

14. An electronic apparatus according to claim 13, further comprising an anisotropic conductive member, the anisotropic conductive member being anisotropic conductive rubber.

15. An electronic apparatus according to claim 13, further comprising an anisotropic conductive member, the anisotropic conductive member being anisotropic conductive film.

* * * * *